United States Patent
Chai et al.

(10) Patent No.: US 12,029,062 B2
(45) Date of Patent: Jul. 2, 2024

(54) DISPLAY PANEL AND DISPLAY DEVICE

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventors: Huiping Chai, Shanghai (CN); Baoyan Chai, Shanghai (CN); Lijing Han, Shanghai (CN); Yuantao Wu, Shanghai (CN)

(73) Assignees: Wuhan Tianma Micro-Electronics Co., Ltd., Wuhan (CN); Wuhan Tianma MicroElectronics Co., Ltd. Shanghai Branch, Shanghai (CN)

( * ) Notice: Subject to any disclaimer, the term of this patent is extended or adjusted under 35 U.S.C. 154(b) by 55 days.

(21) Appl. No.: 17/698,646

(22) Filed: Mar. 18, 2022

(65) Prior Publication Data
US 2023/0217685 A1 Jul. 6, 2023

(30) Foreign Application Priority Data
Dec. 30, 2021 (CN) .......................... 202111656924.3

(51) Int. Cl.
*G06F 3/041* (2006.01)
*H10K 50/842* (2023.01)
*H10K 50/86* (2023.01)

(52) U.S. Cl.
CPC ......... *H10K 50/8428* (2023.02); *G06F 3/041* (2013.01); *H10K 50/86* (2023.02)

(58) Field of Classification Search
CPC .... H10K 50/8428; H10K 50/86; H10K 59/40; G06F 3/041; G06F 3/0412
See application file for complete search history.

(56) References Cited

U.S. PATENT DOCUMENTS

| | | | |
|---|---|---|---|
| 2014/0055958 A1* | 2/2014 | Hsu | B29C 45/14811 361/728 |
| 2014/0092346 A1* | 4/2014 | Yang | H10K 50/84 349/84 |
| 2018/0088631 A1* | 3/2018 | Park | H10K 50/865 |
| 2018/0231834 A1* | 8/2018 | Chen | G02F 1/1341 |
| 2018/0329125 A1* | 11/2018 | Hikita | H05B 33/04 |
| 2019/0392737 A1* | 12/2019 | Du | G09F 9/301 |
| 2021/0333599 A1* | 10/2021 | Zhang | G02F 1/133345 |

FOREIGN PATENT DOCUMENTS

| | | |
|---|---|---|
| CN | 208607848 U | 3/2019 |
| CN | 111446279 A | 7/2020 |

\* cited by examiner

*Primary Examiner* — Temesghen Ghebretinsae
*Assistant Examiner* — Sosina Abebe
(74) *Attorney, Agent, or Firm* — Anova Law Group, PLLC (57) ABSTRACT

A display panel and a display device are provided. The display panel includes a display area and a non-display area surrounding the display area; a first substrate and a second substrate disposed opposite to the first substrate; a plurality of supporting pillars disposed between the first substrate and the second substrate and located in the display area; and an adhesive layer disposed between the first substrate and the second substrate and located in the non-display area. The second substrate includes a plurality of film layers, the plurality of film layers include a polarizer and at least one first layer, and a thickness of a portion of the at least one first layer located in the display area is greater than a thickness of a portion of the at least one first layer located in the non-display area.

11 Claims, 11 Drawing Sheets

DISPLAY PANEL AND DISPLAY DEVICE

CROSS-REFERENCE TO RELATED APPLICATION

This application claims the priority of Chinese Patent Application No. 202111656924.3, filed on Dec. 30, 2021, the content of which is incorporated by reference in its entirety.

TECHNICAL FIELD

The present disclosure generally relates to the field of display technologies and, more particularly, relates to a display panel and a display device.

BACKGROUND

With the development of the display technology, the applications of display panels have become more and more common, and display panels have been gradually applied to people's daily work and life. Among the display panels, OLED display panels have become the mainstream due to their excellent characteristics, such as high contrast, small thickness, wide viewing angle, fast response speed, wide operating temperature range, and simple structure and process. However, the existing display panels has an abnormal appearance under a certain pressure. The present disclosed display panels and display devices are direct to solve one or more problems in the arts.

SUMMARY

One aspect of the present disclosure provides a display panel. The display panel includes a display area and a non-display area surrounding the display area; a first substrate and a second substrate disposed opposite to the first substrate; a plurality of supporting pillars disposed between the first substrate and the second substrate and located in the display area; and an adhesive layer disposed between the first substrate and the second substrate and located in the non-display area. The second substrate includes a plurality of film layers, the plurality of film layers include a polarizer and at least one first layer, and a thickness of a portion of the at least one first layer located in the display area is greater than a thickness of a portion of the at least one first layer located in the non-display area.

Another aspect of the present disclosure provides a display device. The display device includes a display panel. The display panel includes a display area and a non-display area surrounding the display area; a first substrate and a second substrate disposed opposite to the first substrate; a plurality of supporting pillars disposed between the first substrate and the second substrate and located in the display area; and an adhesive layer disposed between the first substrate and the second substrate and located in the non-display area. The second substrate includes a plurality of film layers, the plurality of film layers include a polarizer and at least one first layer, and a thickness of a portion of the at least one first layer located in the display area is greater than a thickness of a portion of the at least one first layer located in the non-display area.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate the embodiments of the present disclosure, and together with the description are used to explain the principle of the present disclosure.

DETAILED DESCRIPTION

The technical solutions in the embodiments of the present disclosure will be clearly and completely described below with reference to the drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative efforts shall fall within the protection scope of the present disclosure.

Many specific details are set forth in the following description to facilitate a full understanding of the present disclosure, but the present disclosure can also be implemented in other ways different from those described herein, and those skilled in the art can do so without departing from the connotation of the present disclosure. Similar promotion, therefore, the present disclosure is not limited by the specific embodiments disclosed below.

Figure 1:
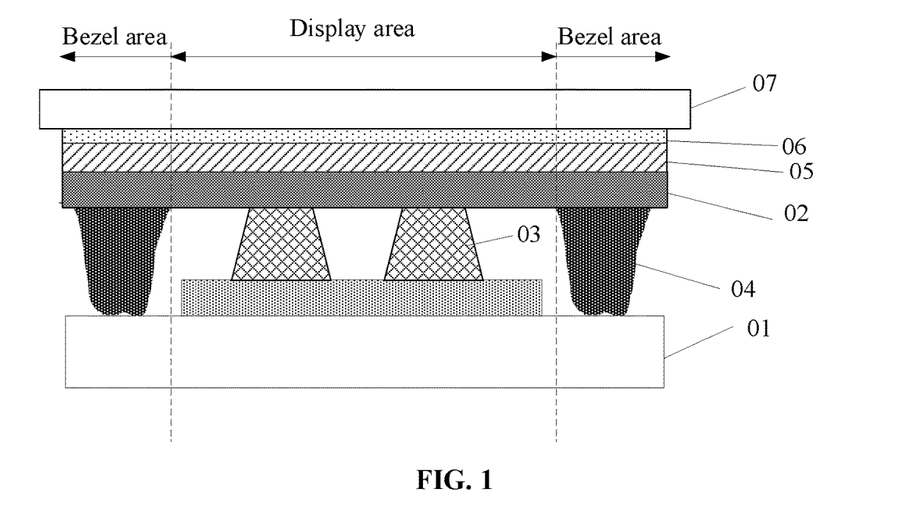
FIG. 1 illustrates a structure of a display panel.

FIG. 1 illustrates the structure of a display panel. As shown in FIG. 1, the display panel includes a TFT substrate 01 and a TP substrate 02 arranged opposite to each other, a supporting pillar 03 and an adhesive layer 04 located between the TFT substrate 01 and the TP substrate 02. Further, a polarizer 05, an optical glue 06 and a cover plate 07 are disposed on the TP substrate 02 facing away from the TFT substrate 01. The supporting pillar 03 is disposed in the display area of the display panel, and the adhesive layer 04 is located in the bezel area of the display panel.

Figure 2:
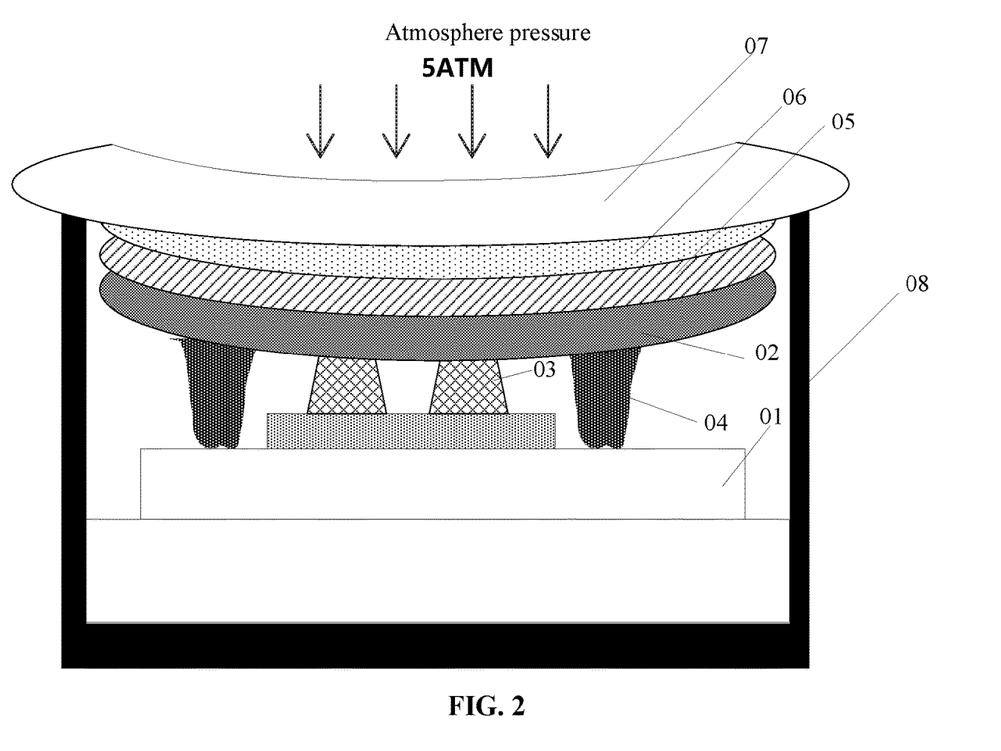
FIG. 2 illustrates a display panel having a downward recessed deformation.

Comparing with the adhesive layer located in the bezel area of the display panel, the supporting strength of the supporting pillar disposed in the display area of the display panel is relatively weak. During the test, when pressed by a certain pressure (for example, during the 5 ATM pressure test and the 5 ATM pressure is applied on the surface of the cover plate), the upper surface of the display area of the display panel may be deformed (recessed downwardly), the deformation as shown in FIG. 2 is formed. Correspondingly, the polarizer 05 between the TP substrate 02 and the cover plate 07 may also be bent downwardly. Thus, when the display panel is not lit, the reflected hue of the display surface of the display panel as viewed by the human eye changes, resulting in an abnormal appearance.

Figure 3:
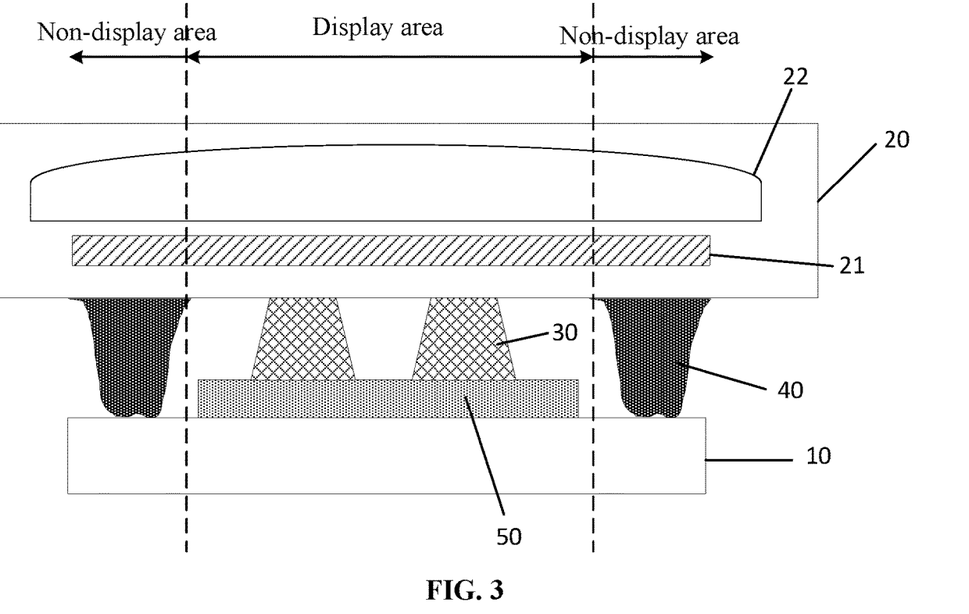
FIG. 3 illustrates an exemplary display panel according to various disclosed embodiments of the present disclosure.

The present disclosure provides a display panel and a display device. FIG. 3 illustrates an exemplary display panel according to various disclosed embodiments of the present disclosure.

As shown in FIG. 3, the display panel may include a display area and a non-display area surrounding the display area. The display panel may also include a first substrate 10 and a second substrate 20 disposed opposite to each other. Further, the display panel may include a plurality of supporting pillars 30 located between the first substrate 10 and the second substrate 20 and located in the display area. Further, the display panel may include an adhesive layer 40 disposed between the first substrate 10 and the second substrate 20 and in the non-display area. In one embodiment, the second substrate 20 may include a plurality of film layers. The plurality of film layers may include a polarizer 21 and at least one first layer 22. The thickness of the at least one first layer 22 disposed in the display area may be greater than the thickness of the at least one first layer 22 disposed in the non-display area. For example, the thickness of the portion of the at least one first layer 22 located in the display area may be greater than the thickness of the portion of the at least one first layer 22 disposed in the non-display area. Accordingly, under the condition that the thicknesses of other layers in the second substrate 20 are constant, by increasing the strength of the portion of the first layer 22 in the display area, the supporting strength of the portion of the second substrate 20 in the display area may be increased. Accordingly, when the display panel is under a certain pressure, the portion of the second substrate 20 located in the display area may not be recessed downwardly compared with the portion of the second substrate 20 in the non-display area such that the polarizer 21 in the second substrate 20 may not be deformed. Thus, the probability of changing the reflected hue of the display surface of the display panel as viewed by the human eye caused by the deformation of the polarizer 21 under the certain pressure when the display panel is not in operation may be reduced, and the probability of an abnormal appearance of the display panel may be reduced.

It should be noted that, in the embodiments of the present disclosure, the abnormal appearance of the display panel may refer to the color change presented by the display surface of the display panel when the display panel is not in operation.

It should also be noted that when the upper surface of the display panel is pressed by a certain pressure, the area on the upper surface of the display panel that is closer to the center of the display surface is relatively more depressed (deformed), and the further away from the center of the display surface, the degree of downward depression of the area may be relatively small. Therefore, in one embodiment of the present disclosure, for the portion of the first layer located above the display area, the closer the area to the center of the display surface is, the greater the thickness of the first layer is, the further the area to the center of the display panel is, the smaller the thickness of the first layer is. By such a configuration, when the display surface of the display panel is pressed, according to the degree of depression in different areas of the display surface, the thickness of the first layer may be increased. On the basis of ensuring that the display surface of the display panel may not be recessed downwardly when the display surface of the display panel is pressed by a certain pressure, the material used for forming the first layer may be reduced, and the cost of the display panel may be reduced.

In one embodiment of the present disclosure, the display panel may further include a multi-layer insulation layer 50 disposed between the plurality of supporting pillars 30 and the first substrate 10. The first substrate 10 may be an array substrate, and the multi-layer insulation layer 50 may include a planarization layer, or a pixel definition layer, etc.

In one embodiment, the display panel is an OLED display panel, but the present application does not limit this. In other embodiments of the present disclosure, the display panel may also be other types of display panels, such as liquid crystal display panels, etc.

The display panel provided by the embodiment of the present disclosure is described below by taking the display panel as an OLED display panel as an example.

Figure 4:
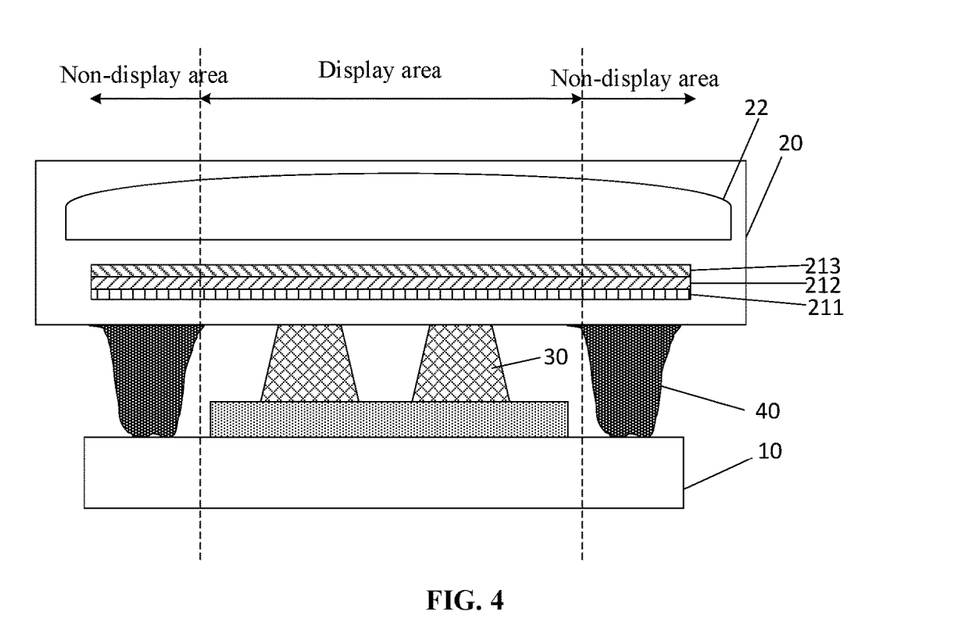
FIG. 4 illustrates another exemplary display panel according to various disclosed embodiments of the present disclosure.

In one embodiment of the present disclosure, as shown in FIG. 4, the polarizer may include a compensation layer 211, a polarizing layer 212 and a protective layer 213 stacked together. The compensation layer 211 may include a slow axis and a fast axis according to different signal transmission speeds. The direction of the light vector with a slow propagation speed of the compensation layer 211 may be referred to as the slow axis, and the direction of the light vector with a fast propagation speed may be referred to the fast axis. For example, the transmission speed in the slow axis direction of the compensation layer 211 may be smaller than the transmission speed in the fast axis direction of the compensation layer 211. It should be noted that, in the OLED display panel, the polarizer may be configured to modulate the light emitted from the outside of the display panel to the display surface of the display panel, thereby reducing the light reflectivity of the display surface of the display panel and improving the display quality. In the liquid crystal display panel, the polarizer may be configured to modulate the light emitted from the inside of the display panel to the display surface of the display panel to cooperate with the display of the display image of the display panel.

The polarizer may be more sensitive to deformation along the slow axis direction of its compensation layer. Therefore, in one embodiment of the present disclosure, the thickness of the portion of the first layer located in the display area may be gradually decreased along a first predetermined direction, and the first predetermined direction may include a first direction. The first direction may be the direction in which the display area points to the non-display area, and may be parallel to the slow axis direction of the compensation layer of the polarizer such that the thickness change direction of the first layer may be parallel to the slow axis direction of the compensation layer. By setting the thickness of the portion of the first layer located in the display area to be gradually decreased in the slow axis direction of the compensation layer, the phenomenon that the reflection hue change of the display surface of the display panel viewed by the human eye changes may be reduced as much as possible when the display panel is not in operation under a certain pressure of the display panel on basis of changing the thickness of the first layer in the first direction.

Figure 5:
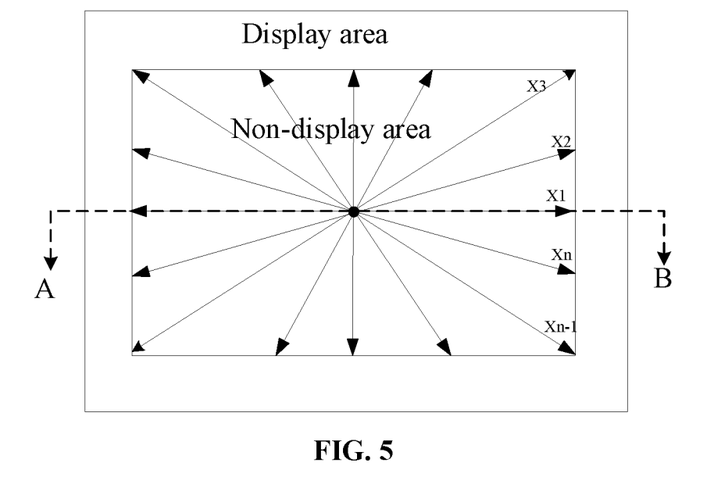
FIG. 5 illustrates a top view of an exemplary display panel according to various disclosed embodiments of the present disclosure.

As shown in FIG. 5, in the display panel, the direction pointing from the display area to the non-display area may include X1, X2 . . . Xn arranged counterclockwise. n is a positive integer. When the slow axis in the compensation layer is parallel to the X1 direction, the first direction may be parallel to the X1 direction, and the first predetermined direction may include a direction parallel to the X1 direction.

In another embodiment of the present disclosure, the first predetermined direction may include directions pointing from the display area to the non-display area, that is, may include directions X1, X2 . . . Xn. Accordingly, by gradually decreasing the thickness of the portion of the first layer located in the display area in all directions pointing from the display area to the non-display area, the phenomenon in which the reflected hue of the display surface of a display panel changes as viewed by the human eye changed when the display panel is not in operation and pressed by a certain pressure may be further reduced.

It should be noted that, in one embodiment of the present disclosure, when the first predetermined direction includes the direction in which X1 is located, as shown in FIG. 5, the schematic diagrams of the structures of the display panels provided in the present disclosure are the AB-sectional view of FIG. 5.

Figure 6:
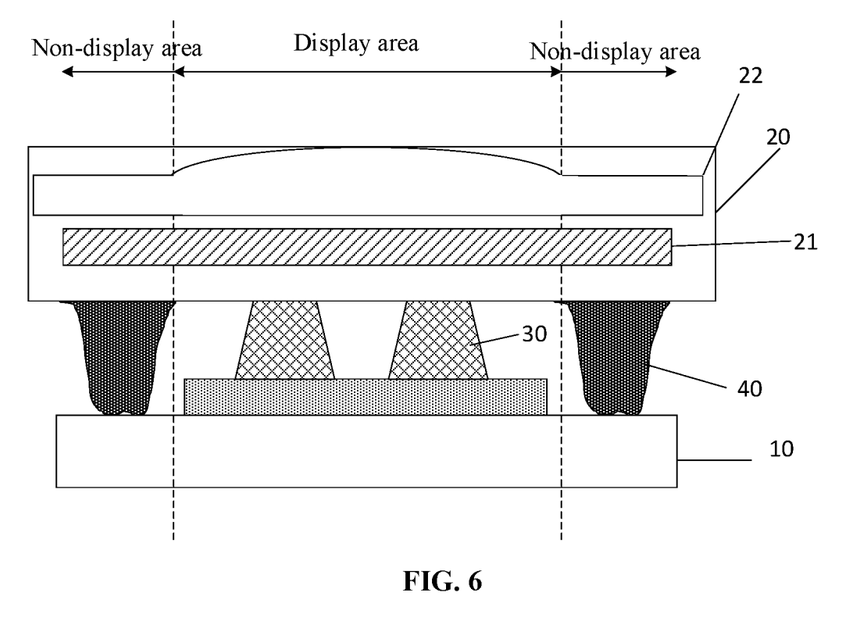
FIG. 6 illustrates another exemplary display panel according to various disclosed embodiments of the present disclosure.

In one embodiment of the present disclosure, the thickness of the portion of the first layer 22 located in the non-display area may be gradually decreased in the first predetermined direction, as shown in FIG. 3, or may be maintained no change, as shown in FIG. 6.

Figure 7:
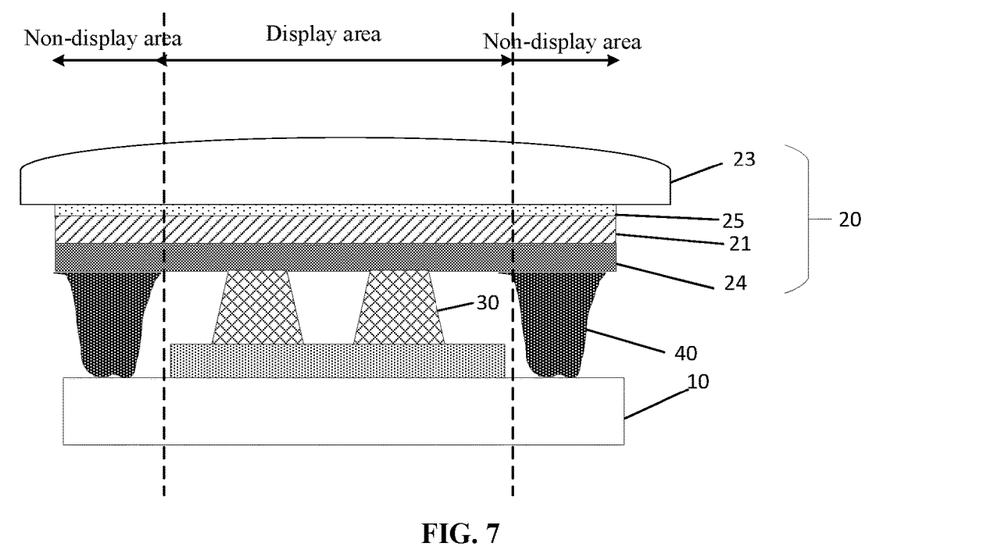
FIG. 7 illustrates another exemplary display panel according to various disclosed embodiments of the present disclosure.

As shown in FIG. 7, in one embodiment of the present disclosure, the plurality of film layers may include a cover plate 23. The cover plate 23 may be disposed on the side of the polarizer 21 facing away from the first substrate 10. In one embodiment, the at least one first layer may include the layer where the cover plate 23 is located, that is, the thickness of the portion of the cover plate 23 located in the display area may be gradually decreased along the first predetermined direction. Accordingly, by setting the thickness of the cover plate 23 along the first predetermined direction, the thickness of the cover plate 23 in the first predetermined direction may be gradually reduced to increase the supporting strength of the cover plate 23 disposed above the polarizer 21. Thus, when the display surface is pressed by a certain pressure, the cover plate 23 may not be deformed, and the polarizer 21 located under the cover plate 23 may not be deformed, and the problem of the hue change caused by the deformation of the polarizer 21 may be solved.

It should be noted that the cover plate is the outermost layer of the display panel. Therefore, in this embodiment, the thickness of the cover plate in the display panel in the first predetermined direction may be changed to solve the hue change caused by the deformation of the polarizer; and such a configuration may not affect the shape of other layers in the display panel, and the compatibility with the existing process may be the highest.

In one embodiment of the present disclosure, the material of the cover plate may be tempered glass such that the cover plate may have a greater supporting strength. Accordingly, when increasing the supporting strength of the second substrate in the display area by increasing the thickness of the cover plate along the first predetermined direction, a smaller thickness may be used to obtain a better supporting strength, and on the basis of solving the problem of the hue change caused by the deformation of the polarizer, the thickness of the display panel may be reduced and the cost of the display panel may be reduced.

In one embodiment of the present disclosure, referring to FIG. 7, the display panel may further include a touch substrate 24 disposed on the side of the polarizer 21 facing toward the first substrate 10 and a first optical adhesive layer 25 bonding the polarizer 21 and the cover plate 23.

Figure 8:
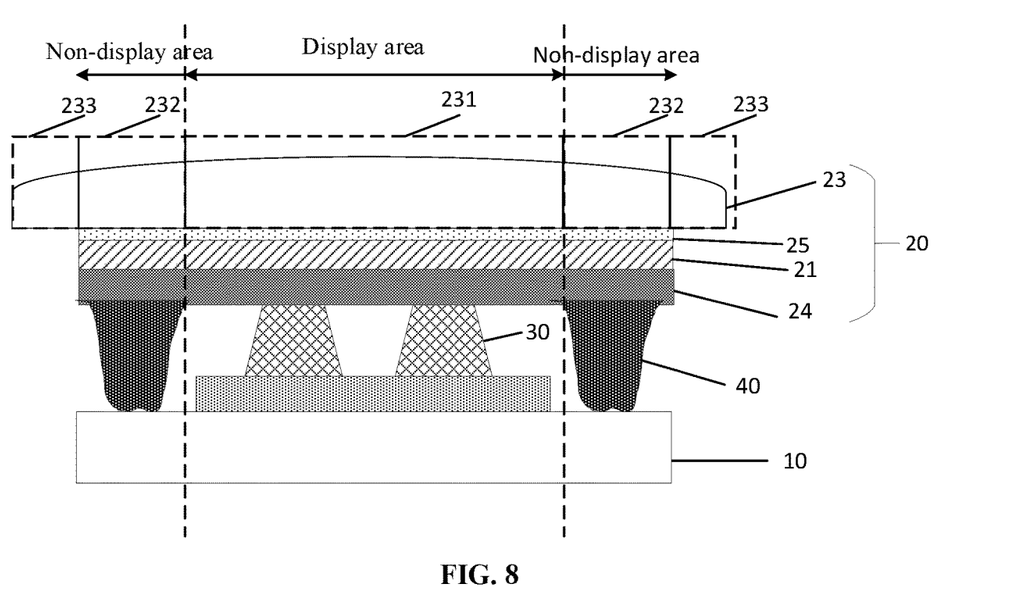
FIG. 8 illustrates another exemplary display panel according to various disclosed embodiments of the present disclosure.
Figure 9:
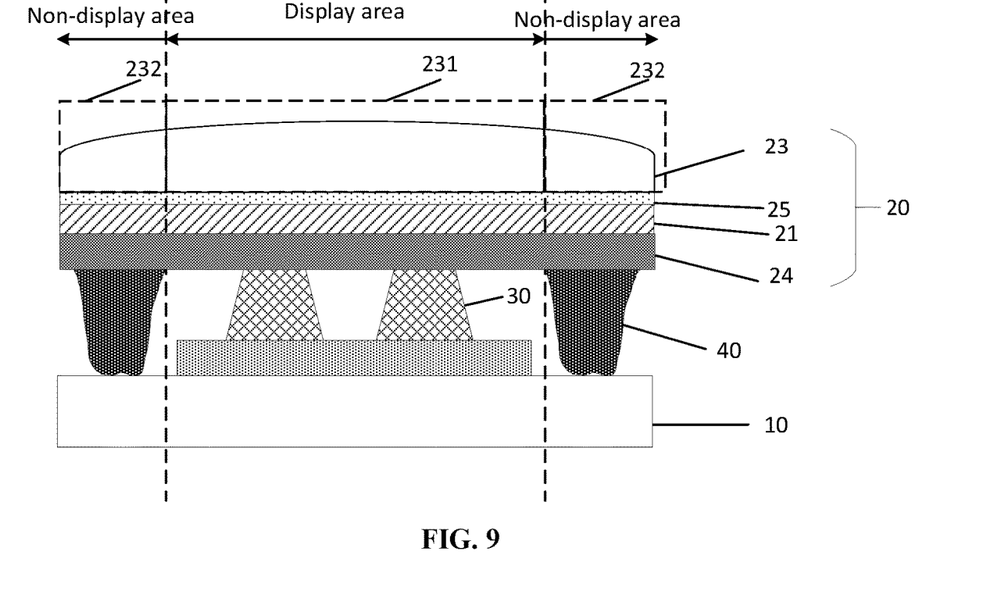
FIG. 9 illustrates another exemplary display panel according to various disclosed embodiments of the present disclosure.

In one embodiment of the present disclosure, as shown in FIG. 8, the cover plate may include a first portion 231, a second portion 232 and a third portion 233. The first portion 231 may be located in the display area, the second portion 232 and the third portion 233 may be located in the non-display area, and the third portion 233 may be located on the side of the second portion 232 facing away from the first portion 231. In other embodiments of the present disclosure, the cover plate 23 may include only the first portion 231 and the second portion 232, no the third portion, as shown in FIG. 9, the configuration may depend on the practical applications.

In one embodiment of the present disclosure, referring to FIG. 8, the cover plate 23 may include the first portion 231, the second portion 232 and the third portion 233. The first portion 231 may be located in the display area, the second portion 232 may be located in the non-display area and above the adhesive layer 40, and the third portion 233 may be located in the non-display area, and may be located in the periphery of the second portion 232. In embodiment, in the direction perpendicular to the display panel, the second portion 232 may cover the adhesive layer 40, and the third portion 233 may not overlap the adhesive layer 40. The positional relationship between the second portion 232, the third portion 233 and the adhesive layer 40 may not be limited by the present disclosure, as long as the first portion 231 may be located in the display area, the second portion 232 and the third portion 233 may be located in the non-display area.

It should be noted that, in the above embodiment, the first portion may be located in the display area, and the thickness of the first portion along the first predetermined direction may be gradually decreased; the second portion may be located in the non-display area, the thickness of the second portion in the first predetermined direction may be gradually decreased, or may remain unchanged.

It should also be noted that, in one embodiment of the present disclosure, as shown in FIG. 8, when the cover plate 23 includes the first portion 231, the second portion 232 and the third portion 233, the thickness of the third portion 233 may be smaller than the thickness of the second portion 232. In the first predetermined direction, the thickness of the third portion 233 may be gradually reduced, such that the overall thickness of the cover plate 23 may be gradually reduced. Therefore, the display surface of the display panel may be a smooth curved surface, and the user experience may be improved.

Figure 10:
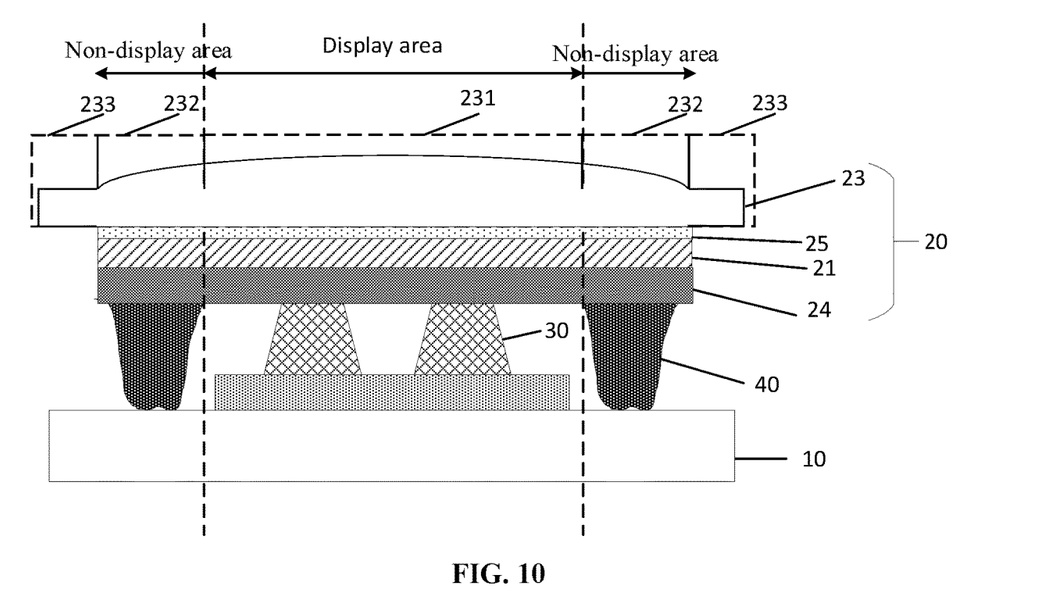
FIG. 10 illustrates another exemplary display panel according to various disclosed embodiments of the present disclosure.

In another embodiment of the present disclosure, as shown in FIG. 10, when the cover plate 23 includes a first portion 231, a second portion 232 and a third portion 233, the thickness of the third portion 233 may be equal to the thickness of the second portion 233. For example, in the first predetermined direction, the thickness of the third portion 233 may be same everywhere such that the portion of the display surface of the display panel corresponding to the third portion 233 may be flat. In one embodiment, the thickness of the third portion 233 may be equal to the thickness of the second portion 232. That the thickness of the third portion 233 may be equal to the thickness of the second portion 232 may mean that the thickness of the third portion 233 may be equal to the thickness of the junction area of the third portion 233 and the second portion 232.

Figure 11:
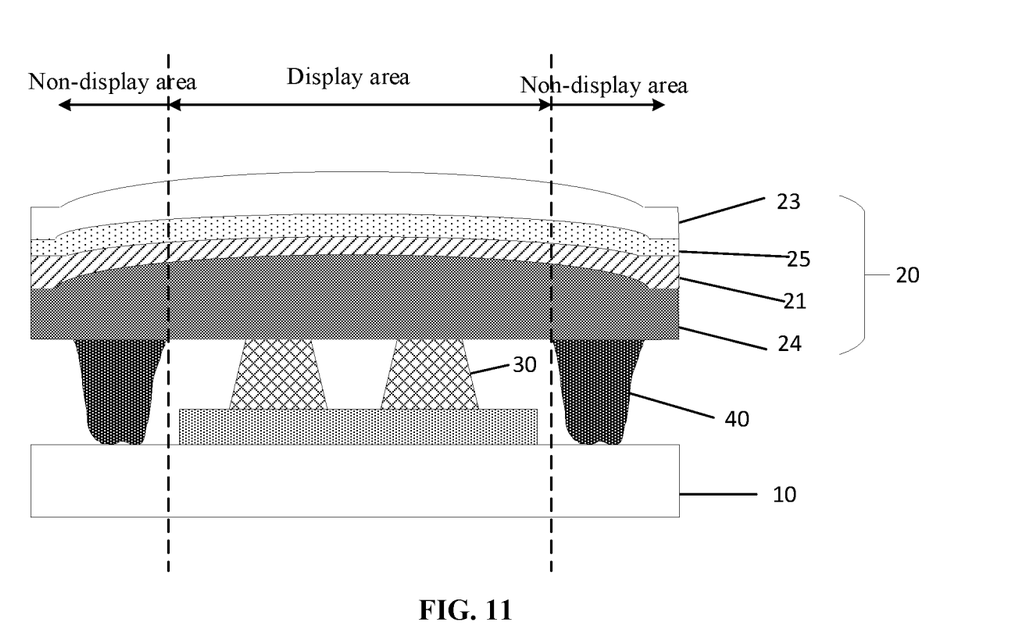
FIG. 11 illustrates another exemplary display panel according to various disclosed embodiments of the present disclosure.

In yet another embodiment of the present disclosure, as shown in FIG. 11, the plurality of film layers may include a touch substrate 24, and the touch substrate 24 may be located on a side of the polarizer 21 facing toward the first substrate 10 such that the display panel may be integrated with the touch function. In one embodiment, the at least one first layer may include the layer where the touch substrate 24 is located, that is, the thickness of the portion of the touch substrate 24 located in the display area may be gradually decreased in the first predetermined direction. Accordingly, by setting the thickness of the touch substrate 24 in the first predetermined direction to be gradually decreased to increase the supporting strength of the touch substrate under the polarizer 21, when the display surface of the display panel is pressed by a certain pressure, the touch substrate 24 may not be deformed such that the polarizer 21 located above the touch substrate 24 may not be deformed. Thus, the hue change caused by the deformation of the polarizer 21 may be solved.

In one embodiment the present disclosure, the thickness of the portion of the touch substrate located in the non-display area may be gradually decreased in the first predetermined direction. In another embodiment of the present disclosure, the thickness of the portion of the touch substrate located in the non-display area may remain unchanged in the first predetermined direction. In other embodiments of the present disclosure, a portion of the touch substrate located in the non-display area may be gradually decreased in the first predetermined direction and a portion of the touch substrate located in the non-display area may remain unchanged.

In the actual manufacturing process, the touch substrate may include a touch electrode layer, a touch wiring layer and an insulation layer, and other layers. Therefore, in the above-mentioned embodiments, the configuration that the thickness of the portion of the touch substrate located in the display area may be greater than the thickness of the touch substrate in the non-display area may be that the thickness of at least one layer of the touch substrate in the display area may be greater than the thickness of the at least one layer of the touch substrate the non-display area, or may be that the thickness of each layer of the touch substrate located in the display area may be greater than the thickness of each layer of the touch substrate in the non-display area, which is not limited in the present disclosure.

On the basis of the above embodiments, in one embodiment of the present disclosure, as shown in FIG. 11, the display panel may include both a touch substrate 24 and a cover plate 23. The touch substrate 24 may be located on the side of the polarizer 21 facing toward the first substrate 10, and the cover plate 23 may be located on the side of the polarizer 21 facing away from the first substrate 20.

In one embodiment of the present disclosure, as shown in FIG. 11, the display panel may include both the touch substrate 24 and the cover plate 23. When the thickness of the portion of the touch substrate 24 located in the display area is gradually decreased in the first predetermined direction, the thickness of the portion of the second substrate 20 located in the display area may also be gradually decreased in the first predetermined direction. The thickness of each film layer of the plurality of film layers located on the side of the touch substrate 24 facing away from the first substrate 10 may be same everywhere in the first predetermined direction to simplify the process difficulty of each film layer of the plurality of film layers located on the side of the touch control substrate 24 facing away from the first substrate 10.

Figure 12:
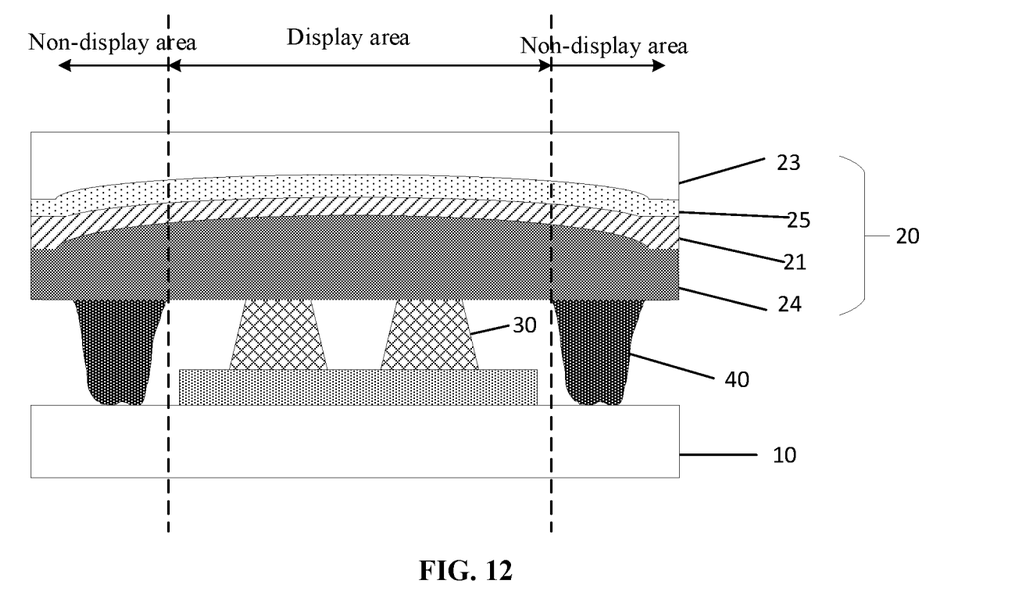
FIG. 12 illustrates another exemplary display panel according to various disclosed embodiments of the present disclosure.

In another embodiment of the present disclosure, as shown in FIG. 12, the display panel may include both a touch substrate 24 and a cover plate 23. When the thickness of the portion of the touch substrate 24 located in the display area is gradually reduced in the first predetermined direction, along the first predetermined direction, the thickness of the portion of the second substrate 20 in the display area may be same everywhere such that the portion of the second substrate 20 facing away from the first substrate 10 and located in the display area may be a flat surface. For example, the display surface of the display panel may be flat.

On the basis of the above-mentioned embodiment, in one embodiment of the present disclosure, as shown in FIG. 12, the display panel may include both a touch substrate 24 and a cover plate 23. When the thickness of the portion of the touch substrate 24 located in the display panel is gradually decreased in the first predetermined direction, and the thickness of the portion of the second substrate 20 located in the display area may be the same everywhere along the first predetermined direction, the thickness of the portion of the cover plate 23 located in the display area may be gradually increased in the first predetermined direction such that the thickness of the portion of the second substrate 20 located in the display area in the first predetermined direction may be made same anywhere by increasing the thickness of the portion of the cover plate 23 located at the position where the thickness of the touch substrate 24 is decreased.

It should be noted that, in one embodiment, in the first predetermined direction, the thickness of the portion of the second substrate located in the non-display area may also be gradually reduced or maintained same. Similarly, the thickness of the portion of the cover plate located in the non-display area may remain unchanged along the first predetermined direction, or may be gradually increased.

In one embodiment of the present disclosure, when the thickness of the portion of the touch substrate located in the non-display area is gradually reduced in a first predetermined direction, and the thickness of the portion of the second substrate is located in the non-display area is gradually reduced in the first direction, the thickness of the portion of the cover plate located in the non-display area may be the same everywhere in the first predetermined direction to reduce the process difficulty of the cover plate located in the non-display area.

In another embodiment of the present disclosure, when the thickness of the portion of the touch substrate located in the non-display area is gradually reduced in a first predetermined direction, and the thickness of the portion of the second substrate located in the non-display area is the same everywhere in the first direction, the thickness of the portion of the cover plate located in the non-display area may be gradually increased in the first predetermined direction to cause the portion of the side surface of the second substrate facing away from the first substrate located in the non-display area to be also flat.

Figure 13:
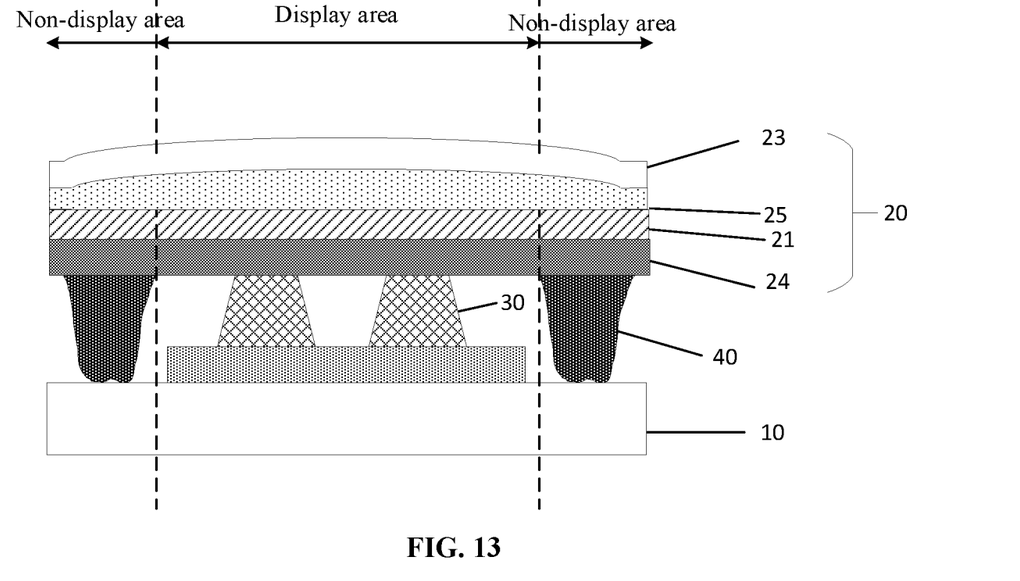
FIG. 13 illustrates another exemplary display panel according to various disclosed embodiments of the present disclosure.

As shown in FIG. 13, in another embodiment of the present disclosure, the plurality of film layers may include a touch substrate 24 located on a side of the polarizer 21 facing toward the first substrate 10, and a first optical adhesive layer 25 disposed on the side of the polarizer 21 facing away from the touch substrate 24 and for bonding the cover plate 23 and the polarizer 21. In one embodiment, the at least one first layer may include the first optical adhesive layer 25. For example, the thickness of the first optical adhesive layer 25 in the display area in the first predetermined direction may be gradually decreased. Thus, by setting the thickness of the first optical adhesive layer 25 in the first predetermined direction, the thickness of the first optical adhesive layer 25 in the first predetermined direction may be gradually reduced to increase the supporting strength of the first optical adhesive layer 25 above the polarizer 21. Accordingly, when the display surface of the display panel is pressed by a certain pressure, the first optical adhesive layer 25 may not be deformed such that the polarizer under the first optical adhesive layer 25 may not be deformed. Thus, the problem of the hue change caused by the deformation of the polarizer may be solved.

Based on the foregoing embodiment, in one embodiment of the present disclosure, the thickness of the portion of the first optical adhesive layer located in the non-display area may be gradually reduced in the first predetermined direction. In another embodiment of the disclosure, the thickness of the portion of the first optical adhesive layer located in the non-display area may remain unchanged in the first predetermined direction.

In one embodiment of the present disclosure, as shown in FIG. 13, when the thickness of the portion of the first optical adhesive layer 25 located in the display area is gradually decreased along the first predetermined direction, along the first predetermined direction, the thickness of the portion of the second substrate 20 located in the display area may be gradually decreased, and the thickness of the cover plate 23 in the first predetermined direction may be same everywhere to reduce the process difficulty of the cover plate.

Figure 14:
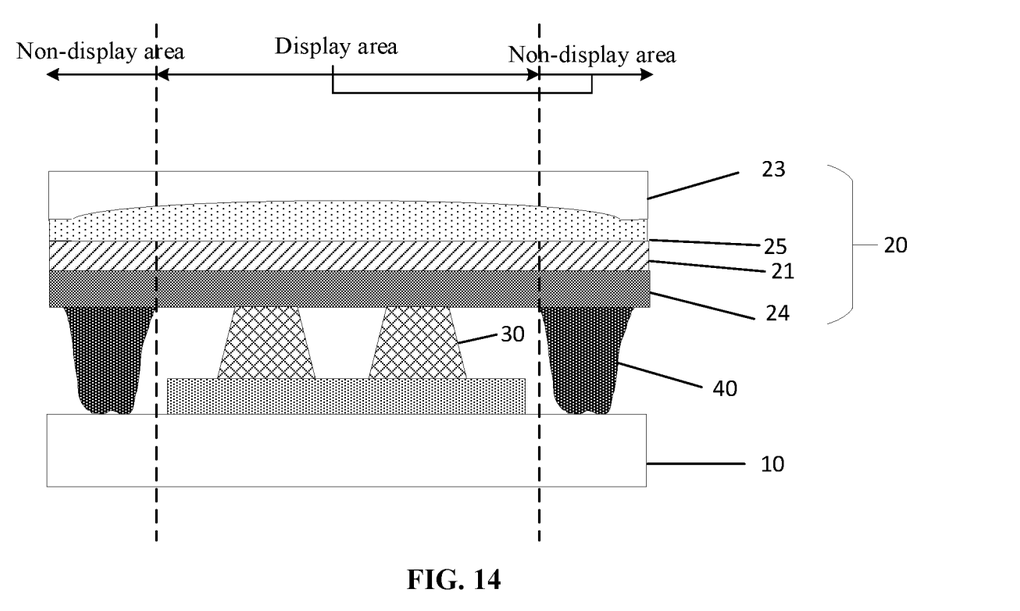
FIG. 14 illustrates another exemplary display panel according to various disclosed embodiments of the present disclosure.

In another embodiment of the present disclosure, as shown in FIG. 14, when the thickness of the portion of the first optical adhesive layer 25 located in the display area is gradually decreased along the first predetermined direction, along the first predetermined direction, the thickness of the portion of the second substrate 20 located in the display area may be same everywhere such that the portion of the surface of the second substrate 20 on the side away from the first substrate 10 located in the display area may be flat. For example, the display surface of the display panel may be flat.

Base on the above embodiment, in one embodiment of the present disclosure, as shown in FIG. 14, when the thickness of the portion of the first optical adhesive layer 25 located in the display area is gradually decreased along the first predetermined direction, and the thickness of the portion of the second substrate 20 located in the display area is same everywhere along the first predetermined direction, the thickness of the portion of the cover plate 23 located in the display area in the first predetermined direction may be gradually increased. Accordingly, by increasing the thickness of the cover plate 23 located where the thickness of the first optical adhesive layer 25 is reduced, the thickness of the portion of the second substrate 20 located in the display area in the first predetermined direction may be same everywhere.

It should be noted that, in one embodiment, in the first predetermined direction, the thickness of the portion of the second substrate located in the non-display area may also be gradually reduced or maintained. Similarly, the thickness of the portion of the cover plate located in the non-display area may be remained unchanged in the first predetermined direction, or may be gradually increased, which is not limited in the present disclosure.

In one embodiment of the present disclosure, when the thickness of the portion of the first optical adhesive layer located in the non-display area is gradually decreased in a first pre-determined direction, and the thickness of the portion of the second substrate located in the non-display area is gradually decreased in the second direction, the thickness of the portion of the cover plate located in the non-display area may be same everywhere in the first predetermined direction to reduce the process difficulty of the portion of the cover plate in the non-display area.

In another embodiment of the present disclosure, when the thickness of the portion of the first optical adhesive layer located in the non-display area is gradually reduced in the first predetermined direction, and the thickness of the second substrate located in the non-display area is the same everywhere in the first direction, the thickness of the portion of the cover plate located in the non-display area may be gradually increased in the first predetermined direction such that the portion of a side surface of the second substrate facing away from the first substrate located in the non-display area may also be flat.

Figure 15:
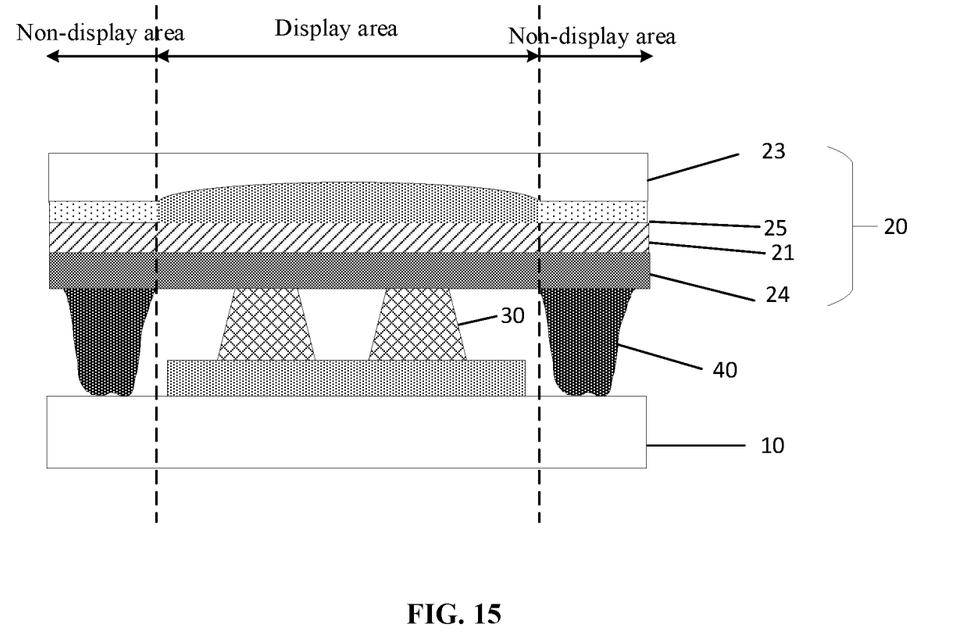
FIG. 15 illustrates another exemplary display panel according to various disclosed embodiments of the present disclosure.

Because the optical adhesive layer may have a certain compressibility, in one embodiment of the present disclosure, as shown in FIG. 15, the compression degree of the first optical adhesive layer 25 in the display area may be greater than the compression degree of the first optical adhesive layer 25 in the non-display area. That is, the compression degree of the portion of the first optical adhesive layer 25 located in the display area may be greater than the compression degree of the portion of the first optical adhesive layer 25 located in the non-display area. By increasing the compression degree of the portion of the first optical adhesive layer 25 located in the display area, the supporting strength of the portion of the first optical adhesive layer 25 located in the display area may be increased, thereby increasing the supporting strength of the portion of the second substrate 20 located in the display area to prevent the portion of the first optical adhesive layer 25 located in the display area from being deformed when the display surface of the display panel is pressed by a certain pressure. Accordingly, the polarizer 21 located under the first optical adhesive layer 25 may not be deformed, and the problem of the hue change caused by the deformation of the polarizer may be solved.

Based on the above-mentioned embodiment, in one embodiment of the present disclosure, in a second predetermined direction, the compression degree of the first optical adhesive layer in the display area may be gradually reduced such that, in the second predetermined direction, the compression degree of the first optical adhesive layer located in the display area may match the pressure received by different areas of the display surface of the display panel. Accordingly, under a certain pressure, on the premise that the display surface of the display panel is not deformed, the material used for forming the first optical adhesive layer may be reduced, and the manufacturing cost of the first optical adhesive layer may be reduced. However, this disclosure does not limit this. In other embodiments of the present disclosure, in the second predetermined direction, the compression degree of the first optical adhesive layer in the display area may be same everywhere, depending on the specific situation.

It can be seen from the foregoing that the polarizer may be sensitive to deformation in the slow axis direction of the compensation layer. Therefore, in one embodiment of the present disclosure, the second predetermined direction may include the first direction such that, in the direction parallel to of the slow axis of the compensation layer, from the center of the display area to the edge of the display area (that is, from the display area to the non-display area), the compression degree of the first optical adhesive layer may be gradually decreased, thereby effectively solving the problem of the hue change caused by the deformation of the polarizer.

In another embodiment of the present disclosure, the second predetermined direction may include various directions pointing from the display area to the non-display area such that, in each direction from the display area to the non-display area, the degree of compression of the first optical adhesive may be arranged to be gradually reduced to reduce the probability of deformation of the polarizer when the display surface of the display panel is pressed by a certain pressure in all directions from the display area to the non-display area, thereby solving the problem of the hue change in the display panel due to the deformation of the polarizer.

It should be noted that, FIG. 15 shows the example that the thickness of the first optical adhesive layer in the display area is greater than the thickness of the first optical adhesive layer in the non-display area, and the compression degree of the first optical adhesive layer in the display area is greater than that of the first optical adhesive layer in the display area.

Figure 16:
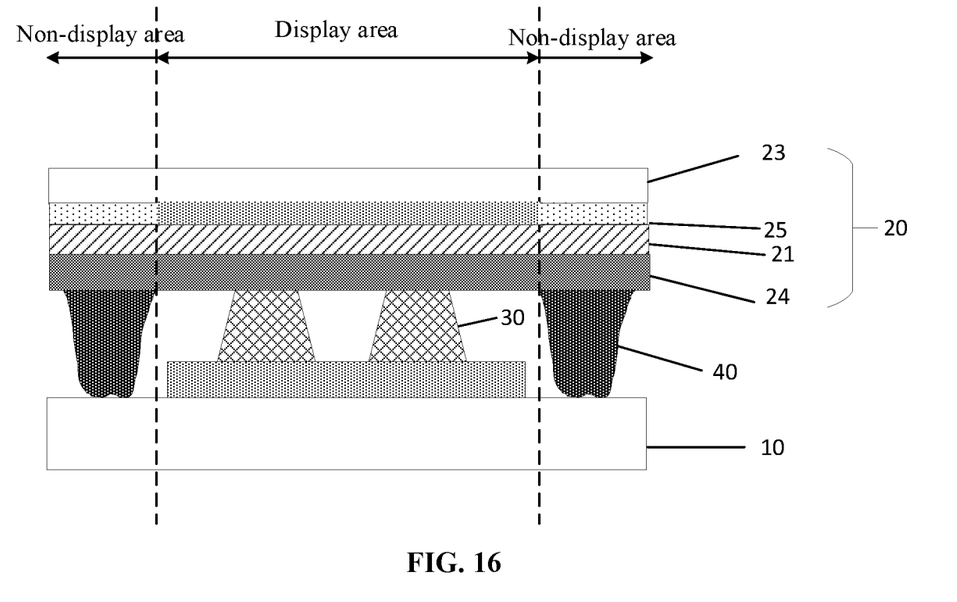
FIG. 16 illustrates another exemplary display panel according to various disclosed embodiments of the present disclosure.

In one embodiment of the present disclosure, as shown in FIG. 16, the thickness of each film layer (e.g., the touch substrate 24, the cover plate 23, and the first optical adhesive layer 25) of the plurality of film layers located in the display area may be same as that of the non-display area, and the compression degree of the first optical adhesive layer 25 in the display area may be greater than the compression degree of the first optical adhesive layer 25 in the non-display area. Accordingly, by only increasing the compression degree of the first optical adhesive layer 25 in the display area, the supporting strength of the first optical adhesive layer 5 in the display area may be increased, thereby increasing the supporting strength of the second substrate 20 in the display area. Thus, the probability that the polarizer 21 is deformed when the display surface of the display panel is pressed by a certain pressure may be reduced, thereby solving the problem of the hue change of the display panel due to the deformation of the polarizer.

For example, in the second predetermined direction, the compression degree of the portion of the first optical adhesive layer in the display area may be gradually reduced such that the compression degree of the first optical adhesive layer in the display area may match pressures received by different areas of the display surface of the display panel. Accordingly, under a certain pressure, while ensuring that the display surface of the display panel is not deformed, the amount of material used for the first optical adhesive layer may be reduced and the manufacturing cost of the first optical adhesive layer may be reduced. In other embodiments of the present disclosure, along the second predetermined direction, the compression degree of the first optical adhesive layer located in the display area may also be the same everywhere.

Figure 17:
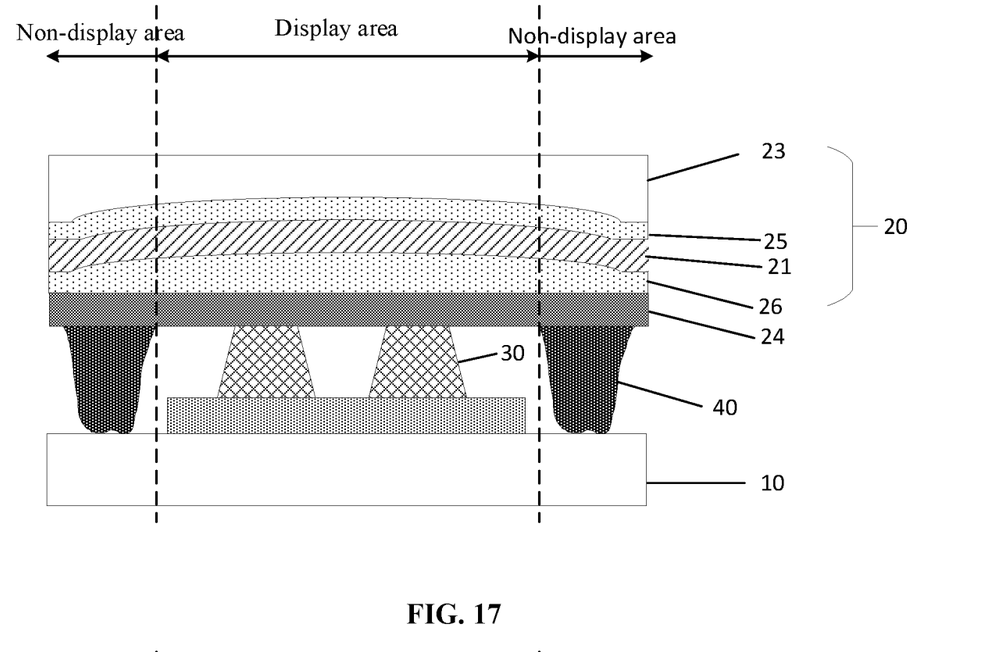
FIG. 17 illustrates another exemplary display panel according to various disclosed embodiments of the present disclosure.

In one embodiment of the present disclosure, as shown in FIG. 17, when the second substrate 20 includes a touch substrate 24, the touch substrate 24 and the polarizer 21 may be fixed by a second optical adhesive layer 26.

It should be noted that, as shown in FIG. 17, when the touch substrate 24 and the polarizer 21 are fixed through the second optical adhesive layer 26, in one embodiment of the present disclosure, the probability of the polarizer 21 being deformed when the display surface of the panel is pressed by a certain pressure may be reduced by setting, in the first predetermined direction, the thickness of the second optical adhesive layer 26 in the display area to be greater than the thickness of the second optical adhesive layer 26 in the non-display area. Accordingly, the problem of the hue change of the display panel due to the deformation of the polarizer may be solved.

Figure 18:
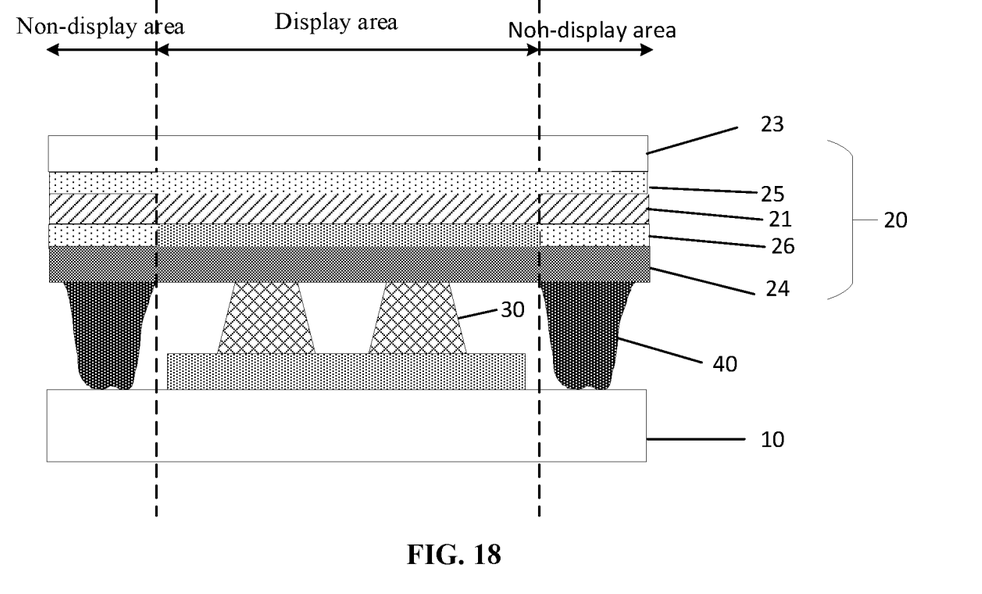
FIG. 18 illustrates another exemplary display panel according to various disclosed embodiments of the present disclosure.

When the touch substrate and the polarizer are fixed through the second optical adhesive layer, in another embodiment of the present disclosure, as shown in FIG. 18, the probability of the polarizer 21 being deformed when the display surface of the display panel is pressed by a certain pressure may be reduced by setting, in the first predetermined direction, the compression degree of the second optical adhesive layer 26 in the display area to be greater than the compression degree of the second optical adhesive layer 26 in the non-display area. Accordingly, the problem of the hue change of the display panel due to the deformation of the polarizer may be solved.

Figure 19:
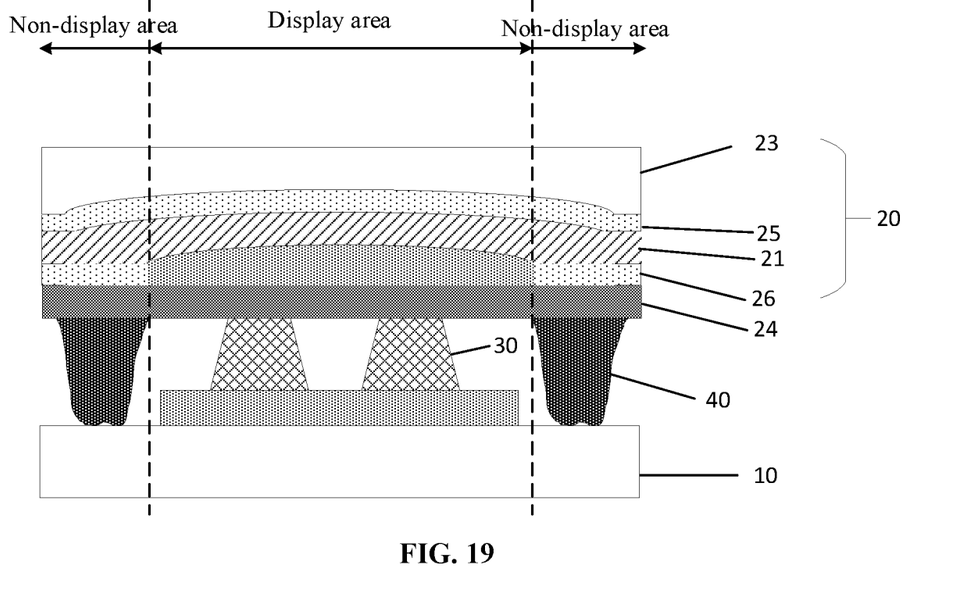
FIG. 19 illustrates another exemplary display panel according to various disclosed embodiments of the present disclosure.

When the touch substrate and the polarizer are fixed through a second optical adhesive layer, in yet another embodiment of the present disclosure, as shown in FIG. 19, the probability of the polarizer 21 being deformed when the display surface of the display panel is pressed by a certain pressure may be reduced by setting, in the first predetermined direction, both the compression degree and the thickness of the second optical adhesive layer 26 in the display area to be greater than both the compression degree and the thickness of the second optical adhesive layer 26 in the non-display area. Accordingly, the problem of the hue change of the display panel due to the deformation of the polarizer may be solved.

It should be noted that, when the second substrate further includes other film layers, the probability of the polarizer being deformed when the display surface of the display panel is pressed by a certain pressure may be reduced by setting the thickness of other layers to solve the problem of the hue change of the display panel due to the deformation of the polarizer.

Figure 20:
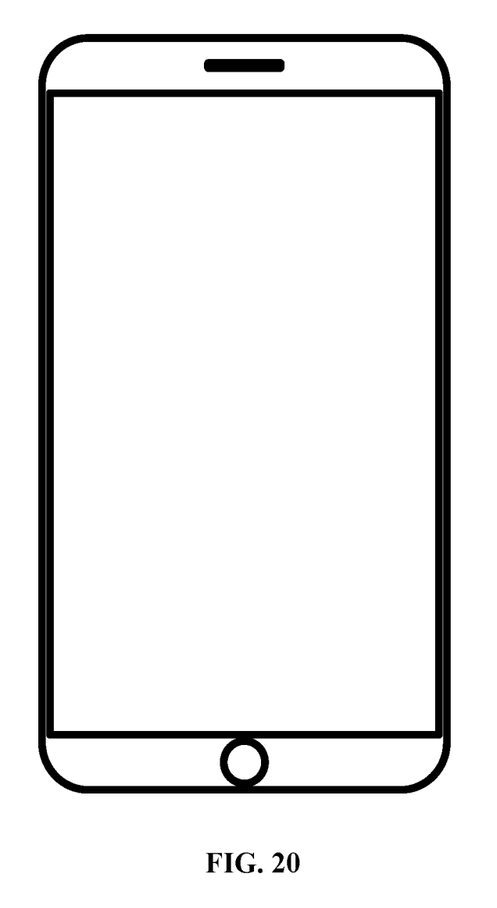
FIG. 20 illustrates an exemplary display device according to various disclosed embodiments of the present disclosure.

The present disclosure also provides a display device. FIG. 20 illustrates an exemplary display device according to various disclosed embodiments of the present disclosure. As shown in FIG. 20, the display device may include a display panel provided in any of the above embodiments.

In the display panel and the display device provided by the embodiments of the present disclosure, the second substrate may include a plurality of film layers, and the plurality of film layers may include a polarizer and at least one first layer. The thickness of the first layer located in the display area may be greater than the thickness of the first layer located in the non-display area. For example, the thickness of the portion of the first layer located in the display area may be greater than the thickness of the portion of the first layer located in the non-display area. Accordingly, under the condition that the thickness of other layers in the second substrate are constant, by increasing the support strength of the portion of the first layer located in the display area, the supporting strength of the portion of the second substrate located in the display area may be increased such that, when the display surface of the display panel is pressed under a certain pressure, the portion of the second substrate located in the display area may not be recessed downwardly relative to the portion of the second substrate 20 located in the non-display area. Thus, the polarizer in the second substrate may not be deformed, and the probability that the reflection hue of the display surface of the display panel viewed by the human eye will change due to the deformation of the polarizer when the display panel is not in operation may be reduced. Thus, the probability of the abnormal appearance of the display panel may be reduced.

Each part in this specification is described in a juxtaposed and progressive manner, and each part focuses on the differences from other parts, and the same and similar parts among the various parts can be referred to each other.

For the above description of the disclosed embodiments, the features described in each embodiment in this specification can be replaced or combined with each other such that those skilled in the art can realize or use the present application. Various modifications to these embodiments will be readily apparent to those skilled in the art, and the generic principles defined herein may be implemented in other embodiments without departing from the spirit or scope of the present disclosure. Therefore, this disclosure is not intended to be limited to the embodiments shown herein, but is to be accorded the widest scope consistent with the principles and novel features disclosed herein.

What is claimed is:

1. A display panel, comprising:
    a display area and a non-display area surrounding the display area;
    a first substrate and a second substrate disposed opposite to the first substrate;
    a plurality of supporting pillars disposed between the first substrate and the second substrate and located in the display area; and
    an adhesive layer disposed between the first substrate and the second substrate and located in the non-display area,
    wherein the second substrate includes a plurality of film layers, the plurality of film layers include a polarizer and at least one first layer, and a thickness of a portion of the at least one first layer located in the display area is greater than a thickness of a portion of the at least one first layer located in the non-display area, wherein the at least one first layer comprises a first portion, a second portion and a third portion, wherein:
    the first portion is located in the display area;
    the second portion and the third portion are located in the non-display area;
    the third portion is located on a side of the second portion away from the first portion;
    a thickness of the third portion is the same everywhere and is equal to a thickness of a junction between the second portion and third portion;
    the plurality of film layers include a touch control substrate disposed on a side of the polarizer facing toward the first substrate, and a first optical adhesive layer disposed on a side of the polarizer facing away from the first substrate and bonding a cover plate and the polarizer, wherein the at least one first layer includes the first optical adhesive layer; and
    a compression degree of a portion of the first optical adhesive layer located in the display area is greater than a compression degree of a portion of the first optical adhesive layer located in the non-display area.

2. The display panel according to claim 1, wherein:
    the thickness of the portion of the at least one first layer located in the display area is gradually decreased in a first predetermined direction;
    the first predetermined direction includes a first direction; and
    the first direction includes a direction pointing from the display area to the non-display area and is parallel to a slow axis direction of a compensation layer of the polarizer.

3. The display panel according to claim 2, wherein:
    the first predetermined direction includes directions pointing from the display area to the non-display area.

4. The display panel according to claim 2,
    wherein the at least one first layer includes a layer where the cover plate is located and the cover plate is disposed on a side of the polarizer facing away from the first substrate.

5. The display panel according to claim 2, wherein:
    the plurality of film layers includes a touch control substrate;
    the at least one first layer includes a layer where the touch control substrate is located; and
    the touch control substrate is disposed on a side of the polarizer facing toward the first substrate.

6. The display panel according to claim 5, wherein:
    in the first predetermined direction, a thickness of the portion of the second substrate located in the display area is gradually decreased.

7. The display panel according to claim 5, wherein:
    in the first predetermined direction, a thickness of the portion of the second substrate located in the display area is same everywhere.

8. The display panel according to claim 7, wherein: the cover plate is disposed on a side of the polarizer facing away from the touch control substrate; and
    in the first predetermined direction, a thickness of the cover plate is gradually increased.

9. The display panel according to claim 1, wherein:
    in a second predetermined direction, a compression degree of the portion of the first optical adhesive layer located in the display area is gradually decreased,
    wherein the second predetermined direction includes a first direction, and the first direction includes a direction pointing from the display area to the non-display area and is parallel to a slow axis direction of a compensation layer of the polarizer.

10. The display panel according to claim 9, wherein:
    the second predetermined direction includes each direction pointing from the display area to the non-display area.

11. A display device, comprising:
    a display panel, including:
    a display area and a non-display area surrounding the display area;
    a first substrate and a second substrate disposed opposite to the first substrate;

a plurality of supporting pillars disposed between the first substrate and the second substrate and located in the display area; and an adhesive layer disposed between the first substrate and the second substrate and located in the non-display area, wherein, the second substrate includes a plurality of film layers, the plurality of film layers include a polarizer and at least one first layer, and a thickness of a portion of the at least one first layer located in the display area is greater than a thickness of a portion of the at least one first layer located in the non-display area, wherein the at least one first layer comprises a first portion, a second portion and a third portion, wherein:

the first portion is located in the display area;

the second portion and the third portion are located in the non-display area;

the third portion is located on a side of the second portion away from the first portion;

a thickness of the third portion is the same everywhere and is equal to a thickness of a junction between the second portion and third portion;

the plurality of film layers include a touch control substrate disposed on a side of the polarizer facing toward the first substrate, and a first optical adhesive layer disposed on a side of the polarizer facing away from the first substrate and bonding a cover plate and the polarizer, wherein the at least one first layer includes the first optical adhesive layer; and a compression degree of a portion of the first optical adhesive layer located in the display area is greater than a compression degree of a portion of the first optical adhesive layer located in the non-display area.

* * * * *